(12) United States Patent
Grover et al.

(10) Patent No.: US 8,724,374 B1
(45) Date of Patent: May 13, 2014

(54) DATA-DEPENDENT PULLUP TRANSISTOR SUPPLY AND BODY BIAS VOLTAGE APPLICATION FOR A STATIC RANDOM ACCESS MEMORY (SRAM) CELL

(71) Applicant: STMicroelectronics International N.V., Amsterdam (NL)

(72) Inventors: Anuj Grover, New Delhi (IN); Gangaikondan Subramani Visweswaran, New Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 30 days.

(21) Appl. No.: 13/655,160

(22) Filed: Oct. 18, 2012

(51) Int. Cl.
| | |
|---|---|
| G11C 7/00 | (2006.01) |
| G11C 7/12 | (2006.01) |
| G11C 11/00 | (2006.01) |
| G11C 5/14 | (2006.01) |
| G11C 11/41 | (2006.01) |
| G11C 11/4074 | (2006.01) |
| G11C 16/30 | (2006.01) |

(52) U.S. Cl.
CPC *G11C 7/00* (2013.01); *G11C 11/41* (2013.01); *G11C 11/4074* (2013.01); *G11C 16/30* (2013.01)
USPC . 365/154; 365/155; 365/189.16; 365/189.09; 365/189.11

(58) Field of Classification Search
CPC .......... G11C 11/41; G11C 5/063; G11C 7/00; G11C 11/00; G11C 5/14; G11C 11/4074; G11C 16/30; G11C 7/12; G11C 13/0069
USPC .......... 365/154, 155, 189.09, 189.11, 189.19, 365/226
See application file for complete search history.

(56) References Cited

U.S. PATENT DOCUMENTS

| | | | | |
|---|---|---|---|---|
| 6,654,276 | B2 * | 11/2003 | Brooks | 365/154 |
| 6,781,870 | B1 * | 8/2004 | Kushida | 365/154 |
| 7,817,460 | B2 * | 10/2010 | Yamagami | 365/154 |
| 2006/0114020 | A1 * | 6/2006 | Taheri et al. | 326/37 |

OTHER PUBLICATIONS

Nho, et al: "A 32nm High-k Metal Gate SRAM with Adaptive Dynamic Stability Enhancement for Low-Voltage Operation," 2010 IEEE International Solid-State Circuits Conference, pp. 346-348.
Kushida, et al: "A 0.7V Single-Supply SRAM with 0.495um2 cell in 65 nm technology utilizing Self-Write-Back Sense Amplifier and Cascaded Bit Line Scheme," 2008 Symposium on VLSI Circuits Digest of Technical Papers, pp. 46-47.

(Continued)

*Primary Examiner* — Ly D Pham
(74) *Attorney, Agent, or Firm* — Gardere Wynne Sewell LLP

(57) ABSTRACT

A memory cell includes a true data node, a true pullup transistor, a complement data node and a complement pullup transistor. A true switching circuit selectively supplies a first or second supply voltage to a source of the true pullup transistor. A true bias switching circuit selectively supplies a third or fourth supply voltage to a body of the true pullup transistor. When writing a logic high data value to the true data storage node, a control circuit causes the true switching circuit to supply the second supply voltage and the true bias switching circuit to supply the third supply voltage. The second supply voltage is higher than the first supply voltage, and the fourth supply voltage is higher than the third supply voltage. A similar operation is performed with respect to the complement pullup transistor when writing a logic high data value to the complement data storage node.

27 Claims, 7 Drawing Sheets

(56) References Cited

OTHER PUBLICATIONS

Wang, et al: "A 4.0 GHz 291Mb Voltage-Scalable SRAM Design in 32nm High-k Metal-Gate CMOS with Integrated Power Management," 2009 IEEE International Solid-State Circuits Conference, pp. 456-458.

Nii, et al: "A 45-nm Single-port and Dual-port SRAM family with Robust Read/Write Stabilizing Circuitry under DVFS Environment," 2008 Symposium on FLSI Circuits Digest of Technical Papers, pp. 212-213.

Yamaoka, et al.: "90-nm Process-Variation Adaptive Embedded SRAM Modules With Power-Line-Floating Write Technique," IEEE Journal of Solid-State Circuits, vol. 41, No. 3, Mar. 2006, pp. 705-711.

Mukhopadhyay, et al: "Capacitive Coupling Based Transient Negative Bit-line Voltage (Tran-NBL) Scheme for Improving Write-ability of SRAM Design in Nanometer Technologies," 2008 IEEE, pp. 384-387.

\* cited by examiner

DATA-DEPENDENT PULLUP TRANSISTOR SUPPLY AND BODY BIAS VOLTAGE APPLICATION FOR A STATIC RANDOM ACCESS MEMORY (SRAM) CELL

TECHNICAL FIELD

The present invention relates to integrated memory circuits and in particular to a static random access memory (SRAM) cell integrated circuit.

BACKGROUND

Reference is made to FIG. 1 which shows a schematic diagram of a standard six transistor (6T) static random access memory (SRAM) cell 10. The cell 10 includes two cross-coupled CMOS inverters 12 and 14, each inverter including a series connected p-channel and n-channel MOSFET transistor pair. The inputs and outputs of the inverters 12 and 14 are coupled to form a latch circuit having a true data storage node 16 and a complement data storage node 18. The cell 10 further includes two transfer (passgate) transistors 20 and 22 whose gate terminals are coupled with a wordline node and are controlled by the signal present at the wordline node (WL). Transistor 20 is source-drain connected between the true data storage node 16 and a node associated with a true bitline (BLT). Transistor 22 is source-drain connected between the complement data storage node 18 and a node associated with a complement bitline (BLC). The source terminals of the p-channel transistors in each inverter 12 and 14 are coupled to receive a high supply voltage (for example, VDD) at a high voltage node $V_H$, while the source terminals of the n-channel transistors in each inverter 12 and 14 are coupled to receive a low reference voltage (for example, GND) at a low voltage node $V_L$. The high supply voltage VDD at the node $V_H$ and the low reference voltage GND at the node $V_L$ comprise the power supply set of voltages for the cell 10.

In an integrated circuit including the SRAM cell 10, this power supply set of voltages may be received at pins of the integrated circuit, or may instead be generated on chip by a voltage regulator circuit which receives some other set of voltages from the pins of the chip. The power supply set of voltages at the nodes $V_H$ and $V_L$ are conventionally applied to the SRAM cell 10 at all times that the cell/integrated circuit is operational.

The reference above to a six transistor SRAM cell 10 of FIG. 1 for use as the data storage element is made by way of example only, it being understood to those skilled in the art that the cell 10 could alternatively comprise a different data storage element. The use of the term SRAM cell will accordingly be understood to refer any suitable memory cell or date storage element, with the circuitry, functionality and operations presented herein in the exemplary context of a six transistor SRAM cell.

SRAM performance is constrained by two independent operations. The first operation is the read operation measured by the time between the read triggering signal and the presence of a valid output. The second operation is the write operation measured by the time between the write triggering signal and a next possible write (or read) triggering signal to ensure a proper write (and a subsequent read).

Those skilled in the art recognize a move in the electronics industry to lower supply voltages for circuits. This is especially the case with respect to memory cells such as SRAM cells. Low voltage functionality for SRAM cells is typically managed by: decoupling the read and write ports of the cell so as to remove the known storage node stability constraint encountered during a read; and sizing the read and write ports independently of each other so as to ensure a correctness of both the read and write operations.

Due to write-margin constraint, the write port of the SRAM cell is sized such that the slowest passgate n-channel transistor will overcome the strength of the fastest (feedback) pull-up p-channel transistor. However, so as to manage a design with a low occupied area, and also to limit current leakage, those skilled in the art understand that the passgate n-channel transistor cannot be very large. This, then, necessitates a cell design where the p-channel transistor is not very strong. With this compromise, the p-channel transistor ends up defining the write time of the cell and limits overall SRAM performance at low supply voltages.

There is a need in the art to address the foregoing problems and constraints.

SUMMARY

In an embodiment, a circuit comprises: a memory cell having a true data storage node and further including a true pullup transistor coupled between a true supply node and the true data storage node; and a supply circuit configured to receive a first supply voltage and a second supply voltage, the second supply voltage being higher than the first supply voltage, the supply circuit further configured to apply the first supply voltage to the true supply node when writing a logic low value to the true data storage node and apply the second supply voltage to the true supply node when writing a logic high value to the true data storage node.

In an enhancement, the supply circuit is further configured to receive a third supply voltage and a fourth supply voltage, the third supply voltage being lower than the fourth supply voltage. The supply circuit is configured to apply the third supply voltage to a body terminal of the true pullup transistor when writing a logic high value to the true data storage node and apply the fourth supply voltage to the body terminal of the true pullup transistor when writing a logic low value to the true data storage node.

In an embodiment, a method comprises: detecting a logic state of a data signal to be written to a memory circuit having a true data storage node and a true pullup transistor coupled between a true supply node and the true data storage node; if the detected logic state is logic low, then applying a first supply voltage to the true supply node during a write operation; and if the detected logic state is logic high, then applying a second supply voltage to the true supply node during the write operation, said second supply voltage being higher than the first supply voltage.

In an enhancement, the method further comprises applying a third supply voltage to the body bias terminal of the true pullup transistor during the write operation if the detected logic state is logic high, and applying a fourth supply voltage to a body bias terminal of the true pullup transistor during the write operation if the detected logic state is logic low (wherein said third supply voltage is lower than said fourth supply voltage).

In an embodiment, a circuit comprises: a memory cell having a true data storage node, a true pullup transistor coupled between a true supply node and the true data storage node, a complement data storage node and a complement pullup transistor coupled between a complement supply node and the complement data storage node; a true switching circuit having a first input coupled to receive a first supply voltage, a second input coupled to receive a second supply voltage, and an output coupled to the true supply node; a complement switching circuit having a first input coupled to receive the first supply voltage, a second input coupled to receive the second supply voltage, and an output coupled to the complement supply node; and a logic circuit configured to cause the true switching circuit to apply the second supply voltage to the true supply node and cause the complement switching circuit to apply the first supply voltage to the complement supply node during a write operation to write a logic high data value to the true data storage node; wherein the second supply voltage is greater than the first supply voltage.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 2:
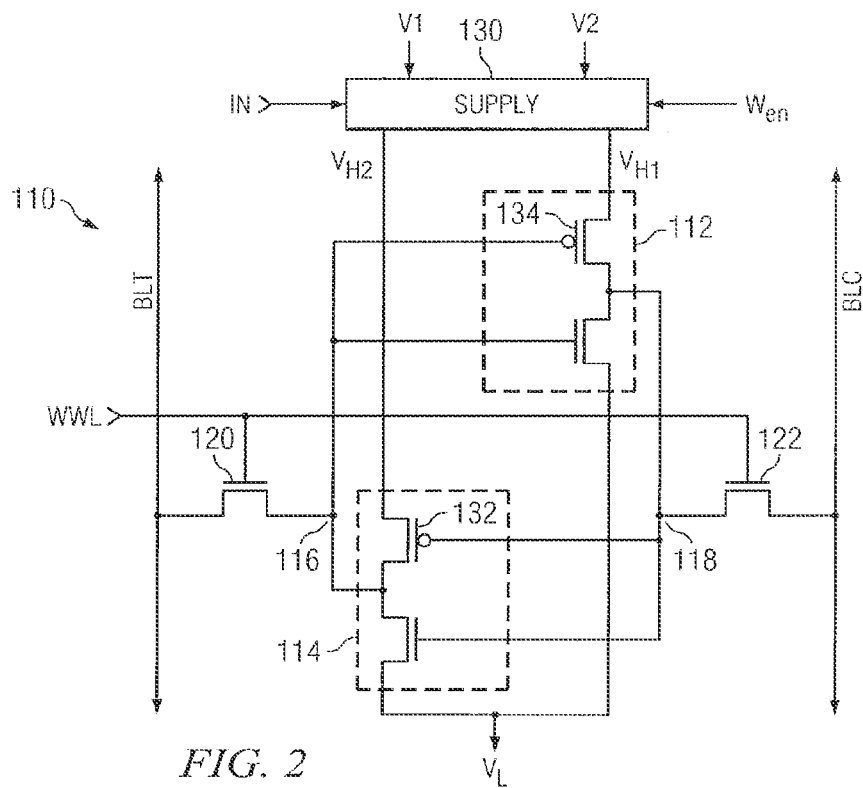
FIG. 2 is a schematic diagram of an embodiment of a six transistor static random access memory (SRAM) cell with data-dependent supply voltage application.

Reference is now made to FIG. 2 which illustrates a schematic diagram of an embodiment of a six transistor static random access memory (SRAM) cell 110 with data-dependent supply voltage application. The cell 110 includes two cross-coupled CMOS inverters 112 and 114, each inverter including a series connected p-channel and n-channel MOSFET transistor pair. The inputs and outputs of the inverters 112 and 114 are coupled to form a latch circuit having a true data storage node 116 and a complement data storage node 118. The cell 110 further includes two n-channel transfer (passgate) transistors 120 and 122 whose gate terminals are coupled with a wordline node and are controlled by the signal present at the wordline node (WL). Transistor 120 is source-drain connected between the true data storage node 16 and a node associated with a true bitline (BLT). Transistor 122 is source-drain connected between the complement data storage node 18 and a node associated with a complement bitline (BLC).

The source terminal of the p-channel transistor in the inverter 112 is coupled to receive a high supply voltage at a first high voltage node $V_{H1}$, while the source terminal of the n-channel transistor in inverter 112 is coupled to receive a low reference voltage (for example, ground) at a low voltage node $V_L$.

The source terminal of the p-channel transistor in the inverter 114 is coupled to receive a high supply voltage at a second high voltage node $V_{H2}$, while the source terminal of the n-channel transistor in inverter 114 is coupled to receive the low reference voltage at the low voltage node $V_L$.

The first high voltage node $V_{H1}$ and the second high voltage node $V_{H2}$ are independent of each other. By this it is meant that a same high supply voltage need not be applied simultaneously to those nodes, and in a certain operating mode of the SRAM cell 110 the voltages applied to the first high voltage node $V_{H1}$ and second high voltage node $V_{H2}$ will purposely be different from each other. In this context, it will be understood that the supply voltages applied to the first high voltage node $V_{H1}$ and second high voltage node $V_{H2}$ are each different from the ground or reference voltage for the memory cell at the node $V_L$.

A voltage supply circuit 130 for the SRAM cell 110 has a first output coupled to the first high voltage node $V_{H1}$, and a second output coupled to the second high voltage node $V_{H2}$. Using the first output of the voltage supply circuit 130, the voltage supply circuit 130 is configured to selectively apply at least two different supply voltages to the first high voltage node $V_{H1}$. Using the second output of the voltage supply circuit 130, the voltage supply circuit 130 is configured to selectively apply at least two different supply voltages to the second high voltage node $V_{H2}$. The selection of the supply voltages to be output from the voltage supply circuit 130 at the first and second outputs thereof is dependent on SRAM cell 110 mode of operation (read versus write) and more particularly is dependent on the logic state of the data being written into the SRAM cell 110.

An input of the voltage supply circuit 130 is coupled to receive an input signal IN indicative of whether the latch circuit formed by the inverters 112 and 114 of the SRAM memory cell 110 is to store a logic low '0' or logic high '1' during a write mode. For example, the input signal IN may be derived from the logic state present on the true bitline (BLT) and/or complement bitline (BLC) during write mode (such as being equal to the signal on the true bitline or set by the logic state output of a write driver circuit coupled to the bitlines). The voltage supply circuit 130 operates in response to the input signal IN by determining which one of the true data storage node 116 and complement data storage node 118 is to be written with a logic high '1', and in response thereto controlling the first and second outputs such that a relatively higher supply voltage is applied to the one of the first high voltage node $V_{H1}$ or second high voltage node $V_{H2}$ that is coupled through a p-channel pullup transistor of the inverter 112 or 114 to that one of the true data storage node 116 and complement data storage node 118 that is to be written with a logic high '1'.

The selective raising of the source supply voltage for the inverter 112 or 114 of the SRAM memory cell 110 associated with the true data storage node 116 or complement data storage node 118 to which a logic high '1' is being written during a write mode serves to improve the strength of the p-channel pullup device (true pullup transistor 132 or complement pullup transistor 134) that is writing the logic high '1' to the latch node. This results in an improvement of the write time because the voltage level at the latch node to which the logic high '1' is being written during write mode rises more quickly due to the increased current being supplied by the associated p-channel pullup device. This increased current will limit the "fight" offered by the other p-channel pullup device to the action of the write driver coupled to the bitlines. The result is an improvement in write margin.

Although not specifically illustrated, it will be understood that the substrates of the transistors shown in FIG. 2 are appropriately biased in a manner well known to those skilled in the art (for example, with the body of the n-channel transistors tied to the reference voltage $V_L$ and the body of the p-channel transistors tied to the supply voltage (for example, the voltage V1) of the memory cell and its associated circuitry).

Figure 3:
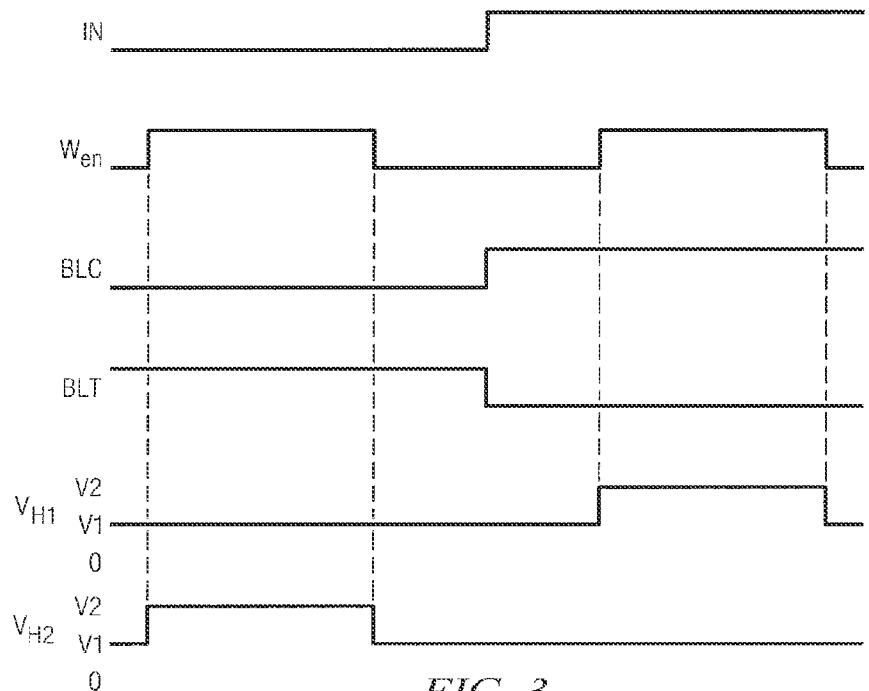
FIG. 3 illustrates exemplary operational waveforms for the static random access memory (SRAM) cell of FIG. 2.

Reference is now made to FIG. 3 which illustrates exemplary operational waveforms for the memory cell 110 of FIG. 2.

Consider a write operation where a logic high '1' is present on the true bitline (BLT) and a logic low '0' is present on the complement bitline (BLC). The voltage supply circuit 130 receives the signal IN indicative of this write condition (for example, derived from the logic high '1' present on the true bitline (BLT)) that a logic high '1' is to be written into the true data storage node 116, and in response thereto controls the first and second outputs such that a relatively higher supply voltage (V2) is applied to the second high voltage node $V_{H2}$ that is coupled through p-channel pullup transistor 132 of the inverter 114 to the true data storage node 116. At this same time, a relatively lower supply voltage (V1) is applied to the first high voltage node $V_{H1}$ that is coupled through p-channel pullup transistor 134 of the inverter 112 to the complement data storage node 118.

Conversely, consider a write operation where a logic low '0' is present on the true bitline (BLT) and a logic high '1' is present on the complement bitline (BLC). The voltage supply circuit 130 receives the signal IN indicative of this write condition (for example, derived from the logic low '0' present on the true bitline (BLT)) that a logic high '1' is to be written into the complement data storage node 118, and in response thereto controls the first and second outputs such that a relatively higher supply voltage (V2) is applied to the first high voltage node $V_{H1}$ that is coupled through p-channel pullup transistor 134 of the inverter 112 to the complement data storage node 118. At this same time, a relatively lower supply voltage (V1) is applied to the second high voltage node $V_{H2}$ that is coupled through p-channel pullup transistor 132 of the inverter 114 to the true data storage node 116.

The voltage supply circuit 130 may further receive a write enable signal Wen indicating that the memory cell 110 is operating in write mode (as opposed to read mode). The voltage supply circuit 130 responds to an active state of the write enable signal Wen (indicating that the memory cell 110 is operation in write mode) to enable the application, in the manner described above, of the relatively higher supply voltage (V2) to an appropriate one of the first high voltage node $V_{H1}$ or the second high voltage node $V_{H2}$ based on the latch node to which the logic high '1' value is being written.

Figure 4:
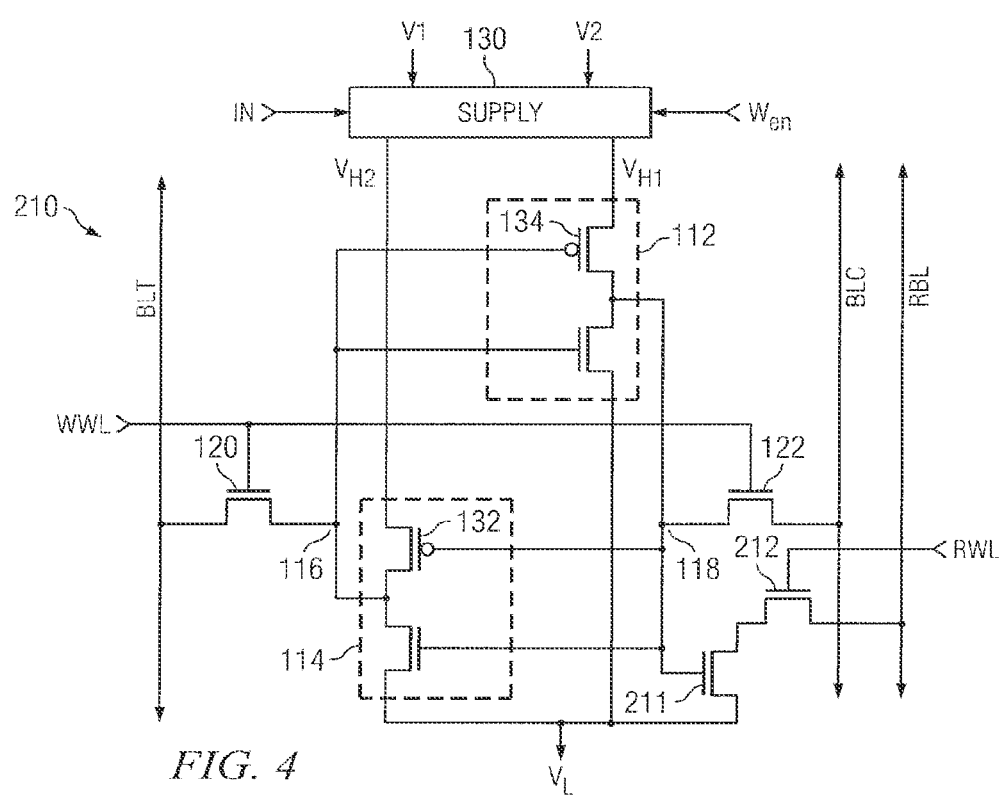
FIG. 4 is a schematic diagram of an embodiment of a static random access memory (SRAM) cell with data-dependent supply voltage application and decoupled read/write ports.

Reference is now made to FIG. 4 which illustrates a schematic diagram of an embodiment of a static random access memory (SRAM) cell 210 with data-dependent supply voltage application and decoupled read/write ports. The cell 210 is the same as the cell 110 of FIG. 2 except that the true bitline (BLT) and complement bitline (BLC) are used to carry data during the write operation, while a read bitline (RBL) is used to carry data during a read operation. The read bitline (RBL) is coupled to the complement data storage node 118 through a series connection of an n-channel control transistor 211 and an n-channel read transistor 212. The gate of the n-channel control transistor 211 is coupled to the complement data storage node 118 and the source of the n-channel control transistor 211 is coupled to the reference voltage node $V_L$. The gate of the n-channel read transistor 212 is coupled to a read wordline (RWL). The voltage supply circuit 130 operates the same manner in FIG. 4 as in FIG. 2 (see, for example, FIG. 3).

Figure 5:
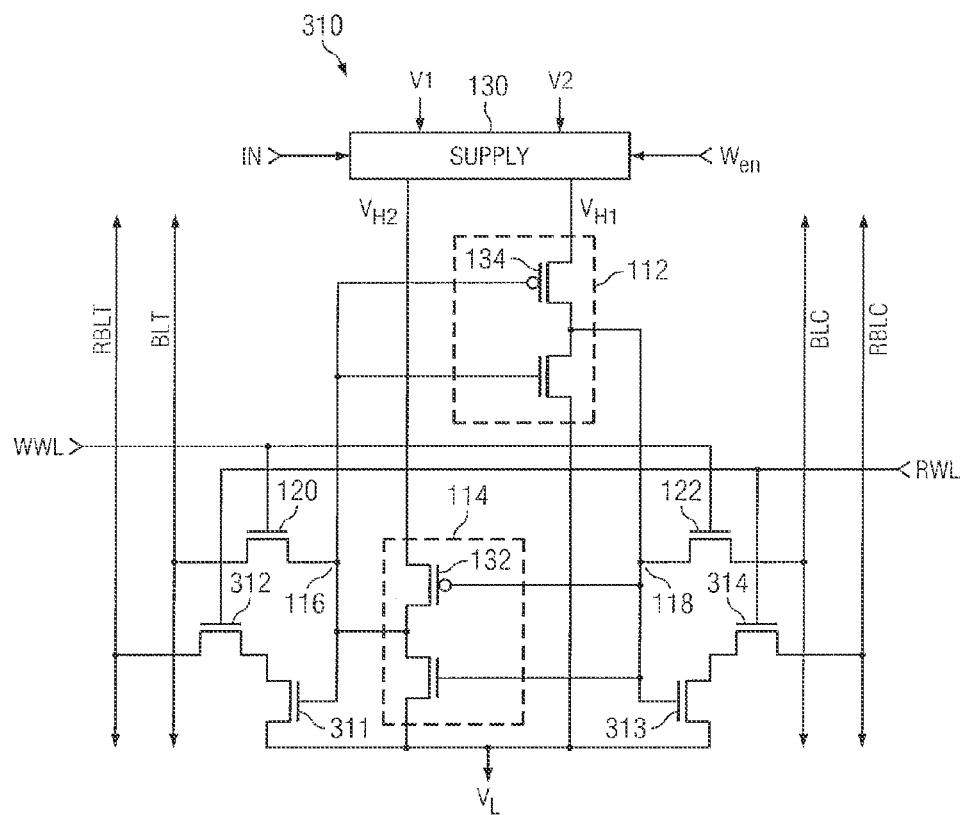
FIG. 5 is a schematic diagram of an embodiment of a static random access memory (SRAM) cell with data-dependent supply voltage application and decoupled read/write ports.

Reference is now made to FIG. 5 which illustrates a schematic diagram of an embodiment of a static random access memory (SRAM) cell 310 with data-dependent supply voltage application and decoupled read/write ports. The cell 310 is the same as the cell 110 of FIG. 2 except that the true bitline (BLT) and complement bitline (BLC) are used to carry data during the write operation, while a true read bitline (RBLT) and complement read bitline (RBLC) are used to carry data during a read operation. The true read bitline (RBLT) is coupled to the true data storage node 116 through a series connection of an n-channel control transistor 311 and an n-channel read transistor 312. The gate of the n-channel control transistor 311 is coupled to the true data storage node 116 and the source of the n-channel control transistor 311 is coupled to the reference voltage node $V_L$. The complement read bitline (RBLC) is coupled to the complement data storage node 118 through a series connection of an n-channel control transistor 313 and an n-channel read transistor 314. The gate of the n-channel control transistor 313 is coupled to the complement data storage node 118 and the source of the n-channel control transistor 313 is coupled to the reference voltage node $V_L$. The gates of the n-channel read transistors 312 and 314 are coupled to a read wordline (RWL). The voltage supply circuit 130 operates the same manner in FIG. 5 as in FIG. 2 (see, for example, FIG. 3).

The connection and configuration of the read transistors 212, 312 and/or 314 as shown in FIGS. 4 and 5 are exemplary only of the circuitry which could be used for supporting decoupled read/write ports. Those skilled in the art will recognize that other circuit connections and configurations could instead be selected.

Figure 1:
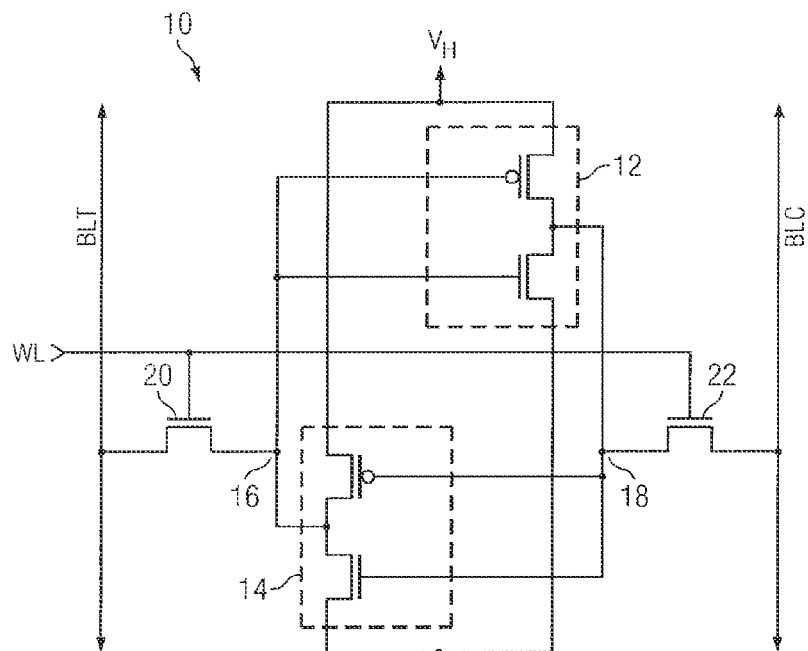
FIG. 1 is a schematic diagram of a standard six transistor static random access memory (SRAM) cell.

The circuits of FIGS. 2, 4 and 5 present a number of advantages over the circuit of FIG. 1 including: write time of the memory cell is significantly improved; write margin of the memory cell is improved; alternatively memory cell leakage is reduced without impacting write performance (which may lead to significant retention energy gains for large arrays of cells); low leakage is evidenced for all unselected columns (and even some cells in a selected column).

Figure 6:
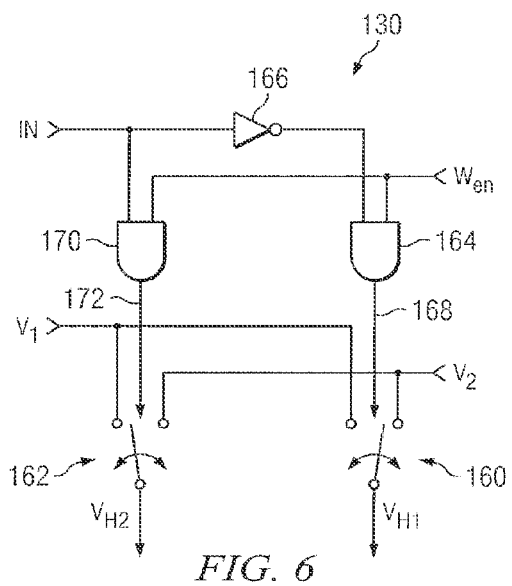
FIG. 6 is a schematic diagram of a data-dependent voltage supply for use in the static random access memory (SRAM) cell of FIG. 2, 4 or 5.

Reference is now made to FIG. 6 wherein there is shown a schematic diagram of a data-dependent voltage supply 130 for use in the static random access memory (SRAM) cell of FIG. 2, 4 or 5. The data-dependent voltage supply 130 is coupled to a first voltage supply at a first voltage level V1 and a second voltage supply at a second voltage level V2. The voltage V2 is higher than the voltage V1. The voltage supplies are preferably regulated voltage supplies.

A first switch 160 includes a first input coupled to the first voltage supply at the first voltage level V1 and a second input coupled to the second voltage supply at the second voltage level V2. The output of the first switch 160 is coupled to the first high voltage node $V_{H1}$.

A second switch 162 includes a first input coupled to the first voltage supply at the first voltage level V1 and a second input coupled to the second voltage supply at the second voltage level V2. The output of the second switch 162 is coupled to the second high voltage node $V_{H2}$.

A first logic circuit 164, illustrated for example as an AND gate, has a first input coupled to receive the write enable signal Wen and a second input coupled to receive a complement of the input signal IN. The complement is generated by a NOT gate 166. An output of the first logic circuit 164 supplies a first selection signal 168 configured to control the switching operation of the first switch 160.

A second logic circuit 170, illustrated for example as an AND gate, has a first input coupled to receive the write enable signal Wen and a second input coupled to receive the input signal IN. An output of the second logic circuit 170 supplies a second selection signal 172 configured to control the switching operation of the second switch 162.

The input signal IN is representative of the data to be written into the memory cell (and more particularly is logically equal to the state of the data to be written to the true data storage node 116 of the memory cell). The write enable signal Wen is logic high when the memory cell is configured into the write mode, and logic low in all other modes.

When the write enable signal Wen is logic high, the first logic circuit 164 passes the complement of the input signal IN as the first selection signal 168 for controlling the switching operation of the first switch 160 and the second logic circuit 170 passes the input signal IN as the second selection signal 172 for controlling the switching operation of the second switch 162.

When a logic high '1' data value is being written to the memory cell (i.e., IN=logic high '1'), the first selection signal 168 is logic low and the second selection signal 172 is logic high. The first switch 160 connects the first voltage supply at the first voltage level V1 to the first high voltage node $V_{H1}$, and the second switch 162 connects the second voltage supply at the second voltage level V2 to the second high voltage node $V_{H2}$. In this configuration, a higher supply voltage (V2) will be present on the second high voltage node $V_{H2}$, for application to the source of pullup transistor 132, when writing a logic high '1' to the true data storage node 116.

Conversely, when a logic low '0' data value is being written to the memory cell (i.e., IN=logic low '0'), the first selection signal 168 is logic high and the second selection signal 172 is logic low. The first switch 160 connects the second voltage supply at the second voltage level V2 to the first high voltage node $V_{H1}$, and the second switch 162 connects the first voltage supply at the first voltage level V1 to the second high voltage node $V_{H2}$. In this configuration, a higher supply voltage (V2) will be present on the first high voltage node $V_{H1}$, for application to the source of pullup transistor 134, when writing a logic high '1' to the complement data storage node 118.

It will be noted that the switches 160 and 162 may further include a third switched terminal each wherein that third switched terminal is coupled to a different supply voltage. In a further operating mode, the switches 160 and 162 may be controlled to select the different supply voltage dependent on memory operating mode. This selection may be made, for example, to select the different supply voltage when the memory is not operating in an access mode. The different supply voltage may, in such a configuration, be a much lower voltage, referred to as a data retention voltage, which serves to reduce leakage in the memory cells.

Figure 7:
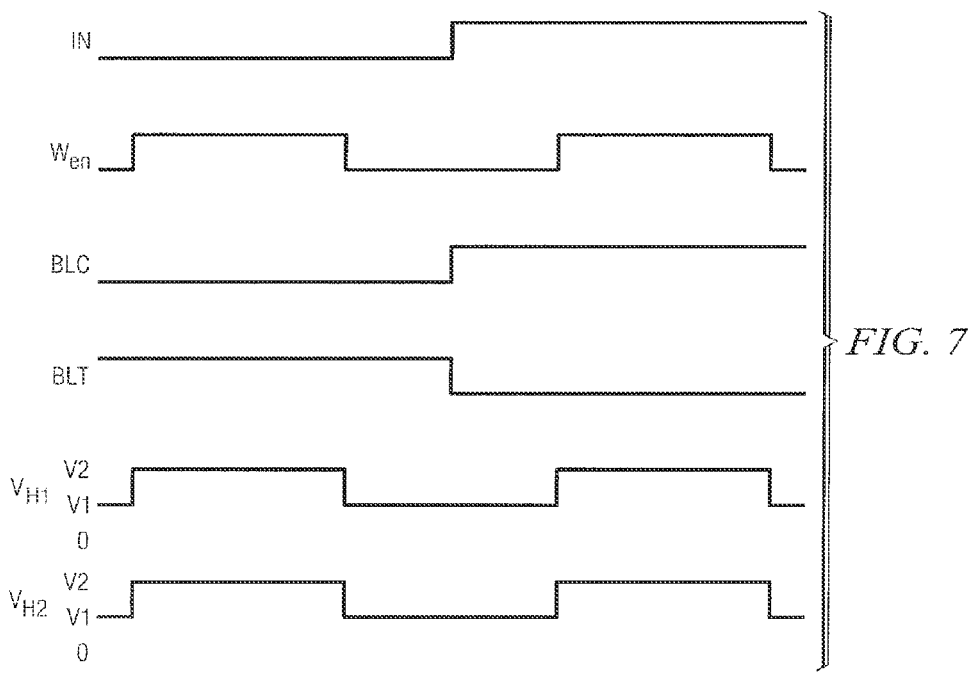
FIG. 7 illustrates exemplary operational waveforms for an alternative operation of the static random access memory (SRAM) cell of FIG. 2.

Reference is now made to FIG. 7 which illustrates exemplary operational waveforms for an alternative operation of the static random access memory (SRAM) cell of FIG. 2. The operation illustrated in FIG. 3 raises the source node voltage during write mode for only the inverter circuit associated with the node which is to store the logic high '1' value. In the alternative operation shown by FIG. 7, the operation is to lower the source node voltage during write mode for only the inverter circuit associated with the node which is to store the logic low '0' value.

Consider a write operation where a logic high '1' is present on the true bitline (BLT) and a logic low '0' is present on the complement bitline (BLC). The voltage supply circuit 130 receives the write enable signal Wen indicating that the memory cell 110 is operating in write mode (as opposed to read mode). The voltage supply circuit 130 responds to an active state of the write enable signal Wen (indicating that the memory cell 110 is operation in write mode) by controlling the first and second outputs such that a relatively higher supply voltage (V2) is applied to the second high voltage node $V_{H2}$ while a relatively lower supply voltage (V1) is applied to the first high voltage node $V_{H1}$. When not in write mode, the voltage supply circuit 130 controls the first and second outputs such that the relatively higher supply voltage (V2) is applied to both the first high voltage node $V_{H1}$ and the second high voltage node $V_{H2}$.

Conversely, consider a write operation where a logic low '0' is present on the true bitline (BLT) and a logic high '1' is present on the complement bitline (BLC). The voltage supply circuit 130 receives the write enable signal Wen indicating that the memory cell 110 is operating in write mode (as opposed to read mode). The voltage supply circuit 130 responds to an active state of the write enable signal Wen (indicating that the memory cell 110 is operation in write mode) by controlling the first and second outputs such that a relatively higher supply voltage (V2) is applied to the first high voltage node $V_{H1}$ while a relatively lower supply voltage (V1) is applied to the second high voltage node $V_{H2}$. When not in write mode, the voltage supply circuit 130 controls the first and second outputs such that the relatively higher supply voltage (V2) is applied to both the first high voltage node $V_{H1}$ and the second high voltage node $V_{H2}$.

It will accordingly be noted that the effective operation in both FIG. 3 and FIG. 7 is to use the voltage supply circuit 130 to create a differential source node supply voltage for the inverters 112 and 114 during write mode such that a relatively lower supply voltage (for example, V1) is applied to one of the first high voltage node $V_{H1}$ and the second high voltage node $V_H$ and a relatively higher supply voltage (for example, V2) is applied to the other of the first high voltage node $V_{H1}$ and the second high voltage node $V_H$. The one of the first high voltage node $V_{H1}$ and the second high voltage node $V_H$ to which the relatively higher supply voltage is applied will be the node associated with the p-channel pull transistor (132 or 134) coupled to the one of the true node 116 or complement node 118 which is to store the logic high '1' value.

Figure 8:
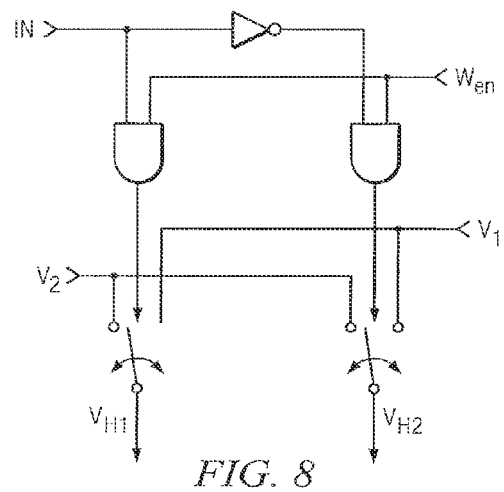
FIG. 8 is a schematic diagram of a data-dependent voltage supply for use in the alternative operation of the static random access memory (SRAM) cell of FIG. 2, 4 or 5.

The data-dependent voltage supply 130 shown in FIG. 6 can be configured to implement the alternative operation shown by FIG. 7. Reference is made to FIG. 8 which illustrates the circuit configuration of the data-dependent voltage supply 130 for FIG. 7 operation. The circuit of FIG. 8 is similar to that of FIG. 6 in configuration, except that the applied voltages V1 and V2 have been exchanged and the first high voltage node $V_{H1}$ and the second high voltage node $V_{H2}$ have been exchanged.

Figure 9:
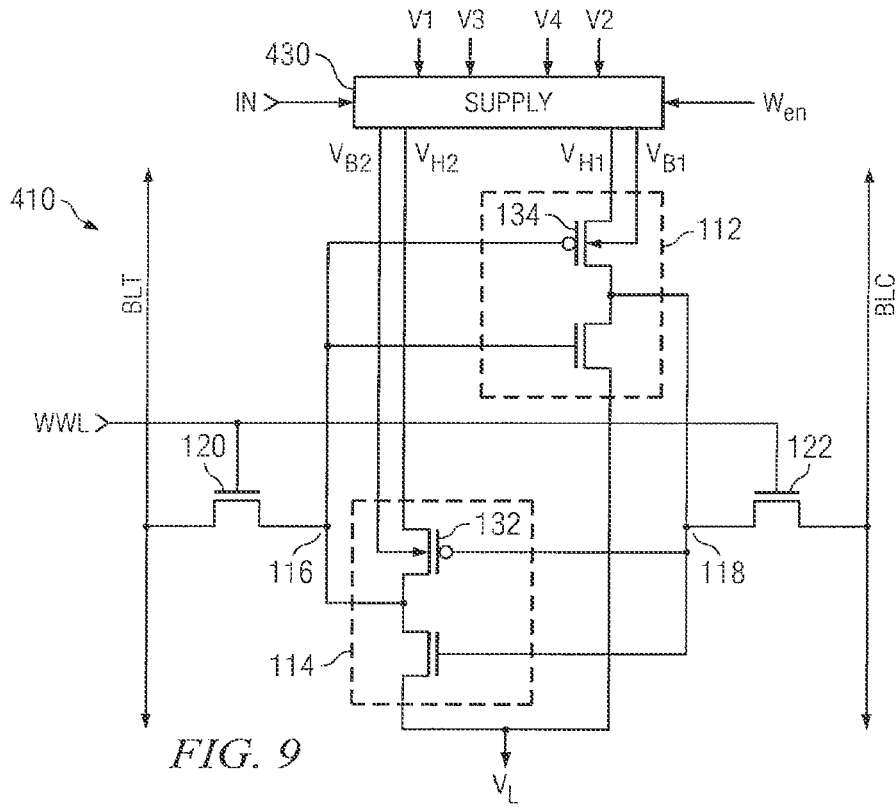
FIG. 9 is a schematic diagram of an embodiment of a six transistor static random access memory (SRAM) cell with data-dependent supply and body bias voltage application.

Reference is now made to FIG. 9 which illustrates a schematic diagram of an embodiment of a six transistor static random access memory (SRAM) cell 410 with data-dependent supply and body bias voltage application.

The cell 410 includes two cross-coupled CMOS inverters 112 and 114, each inverter including a series connected p-channel and n-channel MOSFET transistor pair. The inputs and outputs of the inverters 112 and 114 are coupled to form a latch circuit having a true data storage node 116 and a complement data storage node 118. The cell 410 further includes two n-channel transfer (passgate) transistors 120 and 122 whose gate terminals are coupled with a wordline node and are controlled by the signal present at the wordline node (WL). Transistor 120 is source-drain connected between the true data storage node 16 and a node associated with a true bitline (BLT). Transistor 122 is source-drain connected between the complement data storage node 18 and a node associated with a complement bitline (BLC).

The source terminal of the p-channel transistor in the inverter 112 is coupled to receive a high supply voltage at a first high voltage node $V_{H1}$, while the source terminal of the n-channel transistor in inverter 112 is coupled to receive a low reference voltage (for example, ground) at a low voltage node $V_L$. The body (or bulk) terminal of the p-channel transistor in the inverter 112 is coupled to receive a body bias voltage at a first body bias node $V_{B1}$.

The source terminal of the p-channel transistor in the inverter 114 is coupled to receive a high supply voltage at a second high voltage node $V_{H2}$, while the source terminal of the n-channel transistor in inverter 114 is coupled to receive the low reference voltage at the low voltage node $V_L$. The body (or bulk) terminal of the p-channel transistor in the inverter 114 is coupled to receive a body bias voltage at a second body bias node $V_{B2}$.

The first high voltage node $V_{H1}$ and the second high voltage node $V_{H2}$ are independent of each other. By this it is meant that a same high supply voltage need not be applied simultaneously to those nodes, and in a certain operating mode of the SRAM cell 110 the voltages applied to the first high voltage node $V_{H1}$ and second high voltage node $V_{H2}$ will purposely be different from each other. In this context, it will be understood that the supply voltages applied to the first high voltage node $V_{H1}$ and second high voltage node $V_{H2}$ are each different from the ground or reference voltage for the memory cell at the node $V_L$.

The first body bias node $V_{B1}$ and the second body bias node $V_{B2}$ are independent of each other. By this it is meant that a same body bias voltage need not be applied simultaneously to those nodes, and in a certain operating mode of the SRAM cell 410 the voltages applied to the first body bias node $V_{B1}$ and second body bias node $V_{B2}$ will purposely be different from each other. In this context, it will be understood that the body bias voltages applied to the first body bias node $V_{B1}$ and second body bias node $V_{B2}$ are each different from the ground or reference voltage for the memory cell at the node $V_L$.

A voltage supply circuit 430 for the SRAM cell 410 has a first output coupled to the first high voltage node $V_{H1}$, and a second output coupled to the second high voltage node $V_{H2}$. Using the first output of the voltage supply circuit 430, the voltage supply circuit 430 is configured to selectively apply at least two different supply voltages to the first high voltage node $V_{H1}$. Using the second output of the voltage supply circuit 430, the voltage supply circuit 430 is configured to selectively apply at least two different supply voltages to the second high voltage node $V_{H2}$. The selection of the supply voltages to be output from the voltage supply circuit 430 at the first and second outputs thereof is dependent on SRAM cell 410 mode of operation (read versus write) and more particularly is dependent on the logic state of the data being written into the SRAM cell 410.

The voltage supply circuit 430 for the SRAM cell 410 further has a third output coupled to the first body bias node $V_{B1}$, and a fourth output coupled to the second body bias node $V_{B2}$. Using the third output of the voltage supply circuit 430, the voltage supply circuit 430 is configured to selectively apply at least two different body bias voltages to the first body bias node $V_{B1}$. Using the fourth output of the voltage supply circuit 430, the voltage supply circuit 430 is configured to selectively apply at least two different body bias voltages to the second body bias node $V_{B2}$. The selection of the body bias voltages to be output from the voltage supply circuit 430 at the third and fourth outputs thereof is dependent on SRAM cell 410 mode of operation (read versus write) and more particularly is dependent on the logic state of the data being written into the SRAM cell 410.

An input of the voltage supply circuit 430 is coupled to receive an input signal IN indicative of whether the latch circuit formed by the inverters 112 and 114 of the SRAM memory cell 410 is to store a logic low '0' or logic high '1' during a write mode. For example, the input signal IN may be derived from the logic state present on the true bitline (BLT) and/or complement bitline (BLC) during write mode (such as being equal to the signal on the true bitline or set by the logic state output of a write driver circuit coupled to the bitlines). The voltage supply circuit 430 operates in response to the input signal IN by determining which one of the true data storage node 116 and complement data storage node 118 is to be written with a logic high '1'. In response to that determination, the voltage supply circuit 430 controls the first and second outputs such that a relatively higher supply voltage is applied to the one of the first high voltage node $V_{H1}$ or second high voltage node $V_{H2}$ that is coupled through a p-channel pullup transistor of the inverter 112 or 114 to that one of the true data storage node 116 and complement data storage node 118 that is to be written with a logic high '1'. In further response to that determination, the voltage supply circuit 430 controls the third and fourth outputs such that a relatively lower body bias voltage is applied to the one of the first body bias node $V_{B1}$ or second body bias node $V_{B2}$ of the p-channel pullup transistor of the inverter 112 or 114 associated with that one of the true data storage node 116 and complement data storage node 118 that is to be written with a logic high '1'.

The selective raising of the source supply voltage for the inverter 112 or 114, and/or the selective lowering of the body bias voltage for the p-channel pullup transistor in that inverter, of the SRAM memory cell 110 associated with the true data storage node 116 or complement data storage node 118 to which a logic high '1' is being written during a write mode serves to improve the strength of the p-channel pullup device (true pullup transistor 132 or complement pullup transistor 134) that is writing the logic high '1' to the latch node. This results in an improvement of the write time because the voltage level at the latch node to which the logic high '1' is being written during write mode rises more quickly due to the increased current being supplied by the associated p-channel pullup device. This increased current will limit the "fight" offered by the other p-channel pullup device to the action of the write driver coupled to the bitlines. The result is an improvement in write margin.

Although not specifically illustrated, it will be understood that the substrates of the other transistors shown in FIG. 9 are appropriately biased in a manner well known to those skilled in the art.

Figure 10:
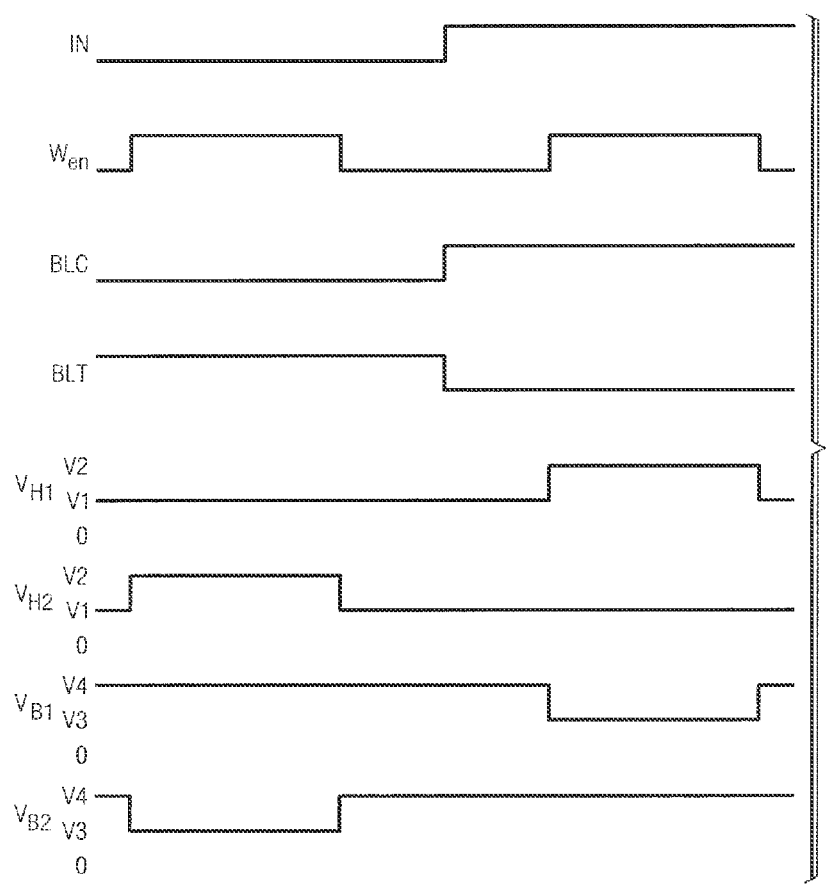
FIG. 10 illustrates exemplary operational waveforms for the static random access memory (SRAM) cell of FIG. 9.

Reference is now made to FIG. 10 which illustrates exemplary operational waveforms for the memory cell 410 of FIG. 9.

Consider a write operation where a logic high '1' is present on the true bitline (BLT) and a logic low '0' is present on the complement bitline (BLC). The voltage supply circuit 430 receives the signal IN indicative of this write condition (for example, derived from the logic high '1' present on the true bitline (BLT)) that a logic high '1' is to be written into the true data storage node 116, and in response thereto controls the first and second outputs such that a relatively higher supply voltage (V2) is applied to the second high voltage node $V_{H2}$ that is coupled through p-channel pullup transistor 132 of the inverter 114 to the true data storage node 116. At this same time, a relatively lower supply voltage (V1) is applied to the first high voltage node $V_{H1}$ that is coupled through p-channel pullup transistor 134 of the inverter 112 to the complement data storage node 118. Still further, the voltage supply circuit 430 controls the third and fourth outputs such that a relatively lower body bias voltage (V3) is applied to the second body bias node $V_{B2}$ for the p-channel pullup transistor 132 of the inverter 114. At this same time, a relatively higher body bias voltage (V4) is applied to the first body bias node $V_{B1}$ for the p-channel pullup transistor 134 of the inverter 112.

Conversely, consider a write operation where a logic low '0' is present on the true bitline (BLT) and a logic high '1' is present on the complement bitline (BLC). The voltage supply circuit 430 receives the signal IN indicative of this write condition (for example, derived from the logic low '0' present on the true bitline (BLT)) that a logic high '1' is to be written into the complement data storage node 118, and in response thereto controls the first and second outputs such that a relatively higher supply voltage (V2) is applied to the first high voltage node $V_{H1}$ that is coupled through p-channel pullup transistor 134 of the inverter 112 to the complement data storage node 118. At this same time, a relatively lower supply voltage (V1) is applied to the second high voltage node $V_{H2}$ that is coupled through p-channel pullup transistor 132 of the inverter 114 to the true data storage node 116. Still further, the voltage supply circuit 430 controls the third and fourth outputs such that a relatively lower body bias voltage (V3) is applied to the first body bias node $V_{B1}$ for the p-channel pullup transistor 134 of the inverter 112. At this same time, a relatively higher body bias voltage (V4) is applied to the second body bias node $V_{B2}$ for the p-channel pullup transistor 132 of the inverter 114.

In this context, the voltages V1 and V4 may be the Vdd supply voltage for the memory cell and its associated circuitry and other circuitry present while the voltage V2 is a boosted voltage relative to V1 and the voltage V3 is a lowered voltage relative to V1. In another alternative, the voltages V2 and V4 may be the Vdd supply voltage for the memory cell and its associated circuitry and other circuitry present while the voltages V1 and V3 are lowered voltages relative to V2 and V4.

The voltage supply circuit 430 may further receive a write enable signal Wen indicating that the memory cell 410 is operating in write mode (as opposed to read mode). The voltage supply circuit 430 responds to an active state of the write enable signal Wen (indicating that the memory cell 410 is operation in write mode) to enable the application, in the manner described above, of the supply voltages and body bias voltages based on the latch node to which the logic high '1' value is being written.

It will be understood that the voltage supply circuit 430 and configuration of the static random access memory (SRAM) cell 410 may also be used in connection with an SRAM cell supporting decoupled read/write ports like that shown in FIGS. 4 and 5.

Figure 11:
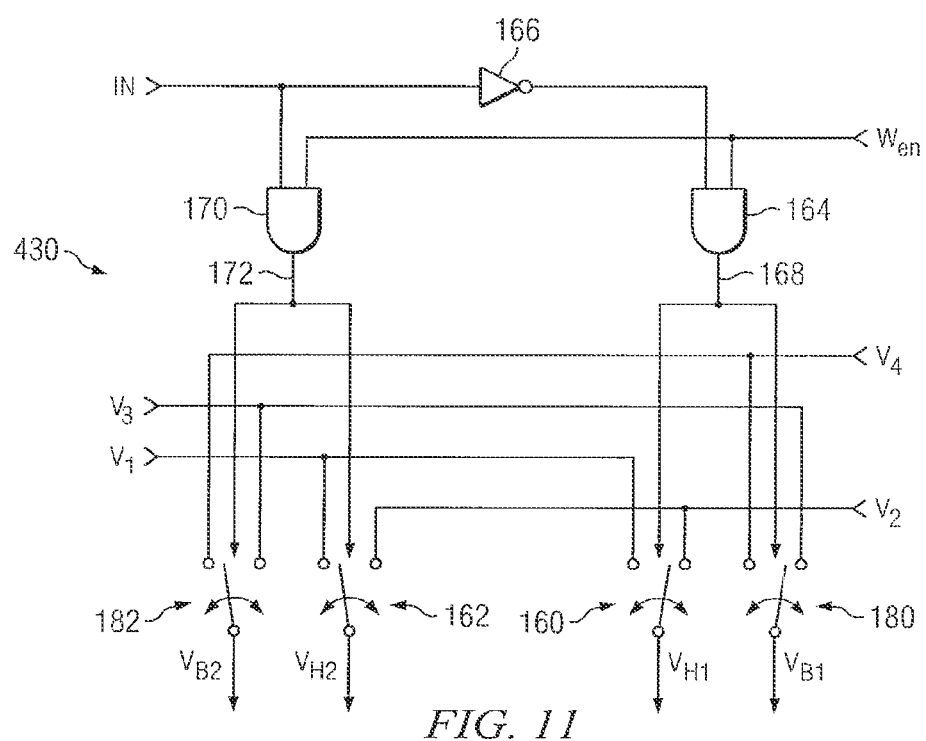
FIG. 11 is a schematic diagram of a data-dependent voltage supply for use in the static random access memory (SRAM) cell of FIG. 9.

Reference is now made to FIG. 11 wherein there is shown a schematic diagram of a data-dependent voltage supply 430 for use in the static random access memory (SRAM) cell of FIG. 9. The data-dependent voltage supply 430 is coupled to a first voltage supply at a first voltage level V1, a second voltage supply at a second voltage level V2, a third voltage supply at a third voltage level V3 and a fourth voltage supply at a fourth voltage level V4. The voltage V2 is higher than the voltage V1, and the voltage V4 is higher than the voltage V3. The voltage supplies are preferably regulated voltage supplies. In an embodiment, the one of the voltages V3 or V4 may equal one of the voltages V1 or V2.

A first switch 160 includes a first input coupled to the first voltage supply at the first voltage level V1 and a second input coupled to the second voltage supply at the second voltage level V2. The output of the first switch 160 is coupled to the first high voltage node $V_{H1}$.

A second switch 162 includes a first input coupled to the first voltage supply at the first voltage level V1 and a second input coupled to the second voltage supply at the second voltage level V2. The output of the second switch 162 is coupled to the second high voltage node $V_{H2}$.

A third switch 180 includes a first input coupled to the fourth voltage supply at the fourth voltage level V4 and a second input coupled to the third voltage supply at the third voltage level V3. The output of the third switch 180 is coupled to the first body bias node $V_{B1}$.

A fourth switch 182 includes a first input coupled to the fourth voltage supply at the fourth voltage level V4 and a second input coupled to the third voltage supply at the third voltage level V3. The output of the fourth switch 182 is coupled to the second body bias node $V_{B2}$.

A first logic circuit 164, illustrated for example as an AND gate, has a first input coupled to receive the write enable signal Wen and a second input coupled to receive a complement of the input signal IN. The complement is generated by a NOT gate 166. An output of the first logic circuit 164 supplies a first selection signal 168 configured to control the switching operation of the first switch 160 and the third switch 180.

A second logic circuit 170, illustrated for example as an AND gate, has a first input coupled to receive the write enable signal Wen and a second input coupled to receive the input signal IN. An output of the second logic circuit 170 supplies a second selection signal 172 configured to control the switching operation of the second switch 162 and the fourth switch 182.

The input signal IN is representative of the data to be written into the memory cell (and more particularly is logically equal to the state of the data to be written to the true data storage node 116 of the memory cell). The write enable signal Wen is logic high when the memory cell is configured into the write mode, and logic low in all other modes.

When the write enable signal Wen is logic high, the first logic circuit 164 passes the complement of the input signal IN as the first selection signal 168 for controlling the switching operation of the first switch 160 and third switch 180 and the second logic circuit 170 passes the input signal IN as the second selection signal 172 for controlling the switching operation of the second switch 162 and fourth switch 182.

When a logic high '1' data value is being written to the memory cell (i.e., IN=logic high '1'), the first selection signal 168 is logic low and the second selection signal 172 is logic high. The first switch 160 connects the first voltage supply at the first voltage level V1 to the first high voltage node $V_{H1}$, and the second switch 162 connects the second voltage supply at the second voltage level V2 to the second high voltage node $V_{H2}$. Additionally, the third switch 180 connects the fourth voltage supply at the fourth voltage level V4 to the first body bias node $V_{B1}$, and the fourth switch 182 connects the third voltage supply at the third voltage level V3 to the second body bias node $V_{B2}$. In this configuration, a higher supply voltage (V2) will be present on the second high voltage node $V_{H2}$, for application to the source of pullup transistor 132, and a lower body bias voltage (V3) will be applied to the body of pullup transistor 132, when writing a logic high '1' to the true data storage node 116.

Conversely, when a logic low '0' data value is being written to the memory cell (i.e., IN=logic low '0'), the first selection signal 168 is logic high and the second selection signal 172 is logic low. The first switch 160 connects the second voltage supply at the second voltage level V2 to the first high voltage node $V_{H1}$, and the second switch 162 connects the first voltage supply at the first voltage level V1 to the second high voltage node $V_{H2}$. Additionally, the third switch 180 connects the third voltage supply at the third voltage level V3 to the first body bias node $V_{B1}$, and the fourth switch 182 connects the fourth voltage supply at the fourth voltage level V4 to the second body bias node $V_{B2}$. In this configuration, a higher supply voltage (V2) will be present on the first high voltage node $V_{H1}$, for application to the source of pullup transistor 134, and a lower body bias voltage (V3) will be applied to the body of pullup transistor 134, when writing a logic high '1' to the complement data storage node 118.

It will be understood that the data-dependent voltage supply 430 may alternatively be configured to operate with respect to the selective application of voltages to the first high voltage node $V_{H1}$ and second high voltage node $V_{H2}$ in the manner shown by FIG. 7 and thus utilize the circuit configuration of FIG. 8. In this configuration, the voltage V4 may equal the voltage V2 and the voltage V3 may equal the voltage V1.

It will also be understood that with each of the implementations shown herein that modulation of the supply voltage as applied to the transistor source terminals and the modulation of the body voltage as applied to the transistor body ties are independently operable features. In other words, a circuit may be designed to implement only source terminal modulation, or only body tie modulation, or implement both.

The reference herein to true and complement with respect to nodes or lines is a matter of labeling convenience and is not intended to be limiting or restricting as to structure or operation. Indeed, depending on logic selected for the circuit, such as active high or active low, the true and complement labels will be understood by those skilled in the art to be exchangeable.

One or more of the signals (IN, Wen, BLC, BLT, etc.) may clocked or a clock may be used as an additional input to the circuit so as to make the operation of the circuit dynamic in nature. Clocking of circuit operations in a memory such as that disclosed herein is well known to those skilled in the art.

Figure 12:
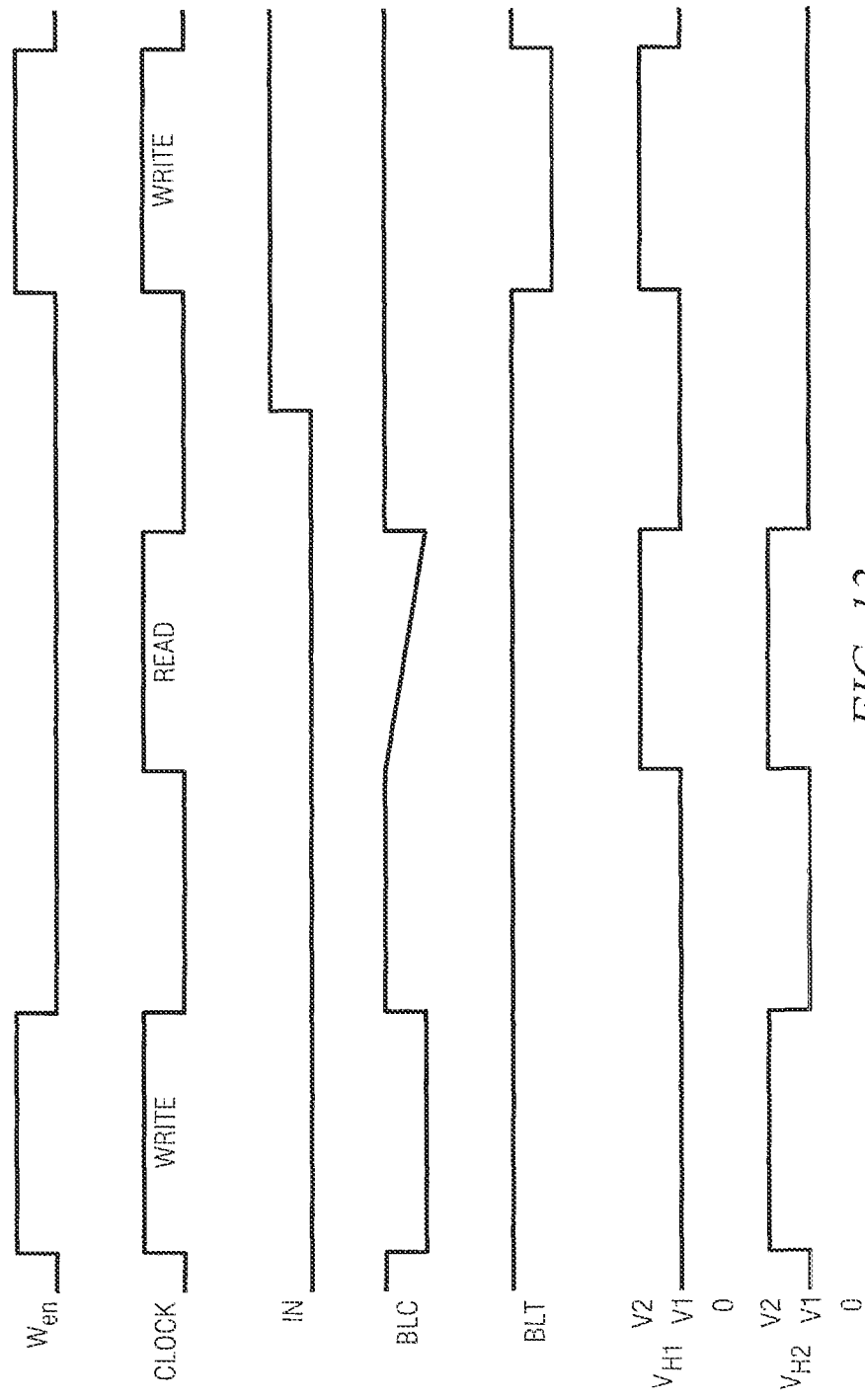
FIG. 12 is a timing diagram illustrating both read and write operations.

Reference is now made to FIG. 12 which illustrates a timing diagram for both read and write operations. What is important to note in FIG. 12 is the raising of the voltage from V1 to V2 on both the first high voltage node $V_{H1}$ and second high voltage node $V_{H2}$ during the clock cycle for the read operation.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a memory cell having a true data storage node and further including a true pullup transistor coupled between a true supply node and the true data storage node; and
   a supply circuit configured to receive a first supply voltage and a second supply voltage, the second supply voltage being higher than the first supply voltage, the supply circuit further configured to apply the first supply voltage to the true supply node when writing a logic low value to the true data storage node and apply the second supply voltage to the true supply node when writing a logic high value to the true data storage node.

2. The circuit of claim 1, wherein the supply circuit is further configured to apply the second supply voltage to the true supply node when reading from the true data storage node.

3. The circuit of claim 1, wherein the supply circuit comprises:
   a true switching circuit having a first input coupled to receive the first supply voltage, a second input coupled to receive the second supply voltage, and an output coupled to the true supply node; and
   a logic circuit configured to generate a switch control signal for application to control switching of the true switching circuit in response to a logic state of a data signal to be written to the memory circuit.

4. The circuit of claim 1, wherein the memory cell further includes a complement data storage node and further including a complement pullup transistor coupled between a complement supply node and the complement data storage node, said supply circuit further configured to apply the first supply voltage to the complement supply node when writing a logic low value to the complement data storage node and apply the second supply voltage to the complement supply node when writing a logic high value to the complement data storage node.

5. The circuit of claim 4, wherein the supply circuit is further configured to apply the second supply voltage to the complement supply node when reading from the complement data storage node.

6. The circuit of claim 4, wherein the supply circuit comprises:
   a complement switching circuit having a first input coupled to receive the first supply voltage, a second input coupled to receive the second supply voltage, and an output coupled to the complement supply node; and
   a logic circuit configured to generate a switch control signal for application to control switching of the complement switching circuit in response to a logic state of a data signal to be written to the memory circuit.

7. The circuit of claim 1, wherein the memory cell is a static random access memory (SRAM) cell.

8. The circuit of claim 1, wherein the true pullup transistor is a p-channel MOSFET and the true supply node is a source node of the p-channel MOSFET.

9. The circuit of claim 1, wherein the supply circuit is configured to receive a third supply voltage and a fourth supply voltage, the third supply voltage being lower than the fourth supply voltage, the supply circuit further configured to apply the third supply voltage to a body terminal of the true pullup transistor when writing a logic high value to the true data storage node and apply the fourth supply voltage to the body terminal of the true pullup transistor when writing a logic low value to the true data storage node.

10. The circuit of claim 9, wherein the supply circuit comprises:

a body bias switching circuit having a first input coupled to receive the third supply voltage, a second input coupled to receive the fourth supply voltage, and an output coupled to the body terminal of the true pullup transistor; and
a logic circuit configured to generate a switch control signal for application to control switching of the body bias switching circuit in response to a logic state of a data signal to be written to the memory circuit.

11. The circuit of claim 9, wherein the second supply voltage equals the fourth supply voltage.

12. The circuit of claim 9, wherein the third supply voltage is less than the first supply voltage.

13. The circuit of claim 9, wherein the memory cell further includes a complement data storage node and further including a complement pullup transistor coupled between a complement supply node and the complement data storage node, said supply circuit further configured to apply the third supply voltage to a body terminal of the complement pullup transistor when writing a logic high value to the complement data storage node and apply the fourth supply voltage to the body terminal of the complement pullup transistor when writing a logic low value to the complement data storage node.

14. The circuit of claim 13, wherein the supply circuit comprises:
a body bias switching circuit having a first input coupled to receive the third supply voltage, a second input coupled to receive the fourth supply voltage, and an output coupled to the body terminal of the complement pullup transistor; and
a logic circuit configured to generate a switch control signal for application to control switching of the body bias switching circuit in response to a logic state of a data signal to be written to the memory circuit.

15. A method, comprising:
detecting a logic state of a data signal to be written to a true data storage node of a memory circuit having a true pullup transistor coupled between a true supply node and the true data storage node;
if the detected logic state is logic low, then applying a first supply voltage to the true supply node during a write operation; and
if the detected logic state is logic high, then applying a second supply voltage to the true supply node during the write operation;
wherein said second supply voltage is higher than the first supply voltage.

16. The method of claim 15, wherein the memory circuit further has a complement data storage node and a complement pullup transistor coupled between a complement supply node and the complement data storage node, the method further comprising:
if the detected logic state is logic low, then applying the second supply voltage to the complement supply node during the write operation; and
if the detected logic state is logic high, then applying the first supply voltage to the complement supply node during the write operation.

17. The method of claim 15, wherein the memory cell is a static random access memory (SRAM) cell.

18. The method of claim 15, wherein the true pullup transistor is a p-channel MOSFET and the true supply node is a source node of the p-channel MOSFET.

19. The method of claim 15, further comprising:
if the detected logic state is logic high, then applying a third supply voltage to the body bias terminal of the true pullup transistor during the write operation; and
if the detected logic state is logic low, then applying a fourth supply voltage to a body bias terminal of the true pullup transistor during the write operation;
wherein said third supply voltage is lower than said fourth supply voltage.

20. The method of claim 15, wherein the memory circuit further has a complement data storage node and a complement pullup transistor coupled between a complement supply node and the complement data storage node, the method further comprising:
if the detected logic state is logic low, then applying a third supply voltage to a body bias terminal of the complement pullup transistor during the write operation; and
if the detected logic state is logic high, then applying a fourth supply voltage to the body bias terminal of the complement pullup transistor during the write operation;
wherein said third supply voltage is lower than said fourth supply voltage.

21. A circuit, comprising:
a memory cell having a true data storage node, a true pullup transistor coupled between a true supply node and the true data storage node, a complement data storage node and a complement pullup transistor coupled between a complement supply node and the complement data storage node;
a true switching circuit having a first input coupled to receive a first supply voltage, a second input coupled to receive a second supply voltage, and an output coupled to the true supply node;
a complement switching circuit having a first input coupled to receive the first supply voltage, a second input coupled to receive the second supply voltage, and an output coupled to the complement supply node; and
a logic circuit configured to cause the true switching circuit to apply the second supply voltage to the true supply node during a write operation to write a logic high data value to the true data storage node and to apply the first supply voltage to the true supply node during a write operation to write a logic low data value to the true data storage node; and
wherein the second supply voltage is greater than the first supply voltage.

22. The circuit of claim 21, wherein the logic circuit is further configured to cause the complement switching circuit to apply the second supply voltage to the complement supply node during a write operation to write a logic high data value to the complement data storage node and to apply the first supply voltage to the complement supply node during a write operation to write a logic low data value to the complement data storage node.

23. The circuit of claim 21, wherein the logic circuit is further configured to cause the true and complement switching circuits to apply the second supply voltage to the true supply node and complement supply node, respectively, during a read operation from either the true or complement data storage node.

24. The circuit of claim 21, wherein the memory cell is a static random access memory (SRAM) cell.

25. The circuit of claim 21, wherein the true and complement pullup transistors are each a p-channel MOSFET and the true and complement supply nodes are each a source node of the p-channel MOSFET.

26. The circuit of claim 21, further comprising:
a true body bias switching circuit having a first input coupled to receive a third supply voltage, a second input coupled to receive a fourth supply voltage, and an output coupled to a body bias terminal of the true pullup transistor; and a complement body bias switching circuit having a first input coupled to receive the third supply voltage, a second input coupled to receive the fourth supply voltage, and an output coupled to a body bias terminal of the complement pullup transistor;

wherein the third supply voltage is less than the first supply voltage.

27. The circuit of claim 26, wherein the logic circuit is further configured to cause the true body bias switching circuit to apply the third supply voltage to the body bias terminal of the true pullup transistor and cause the complement body bias switching circuit to apply the fourth supply voltage to the body bias terminal of the complement pullup transistor during a write operation to write the logic high data value to the true data storage node.

\* \* \* \* \*